(12) United States Patent
Gruendl et al.

(10) Patent No.: US 9,276,183 B2
(45) Date of Patent: Mar. 1, 2016

(54) OPTOELECTRONIC SEMICONDUCTOR COMPONENT AND METHOD FOR PRODUCING SUCH AN OPTOELECTRONIC SEMICONDUCTOR COMPONENT

(71) Applicant: OSRAM Opto Semiconductors GmbH, Regensburg (DE)

(72) Inventors: Andreas Gruendl, Laaber (DE); Stefan Gruber, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/386,239

(22) PCT Filed: Mar. 18, 2013

(86) PCT No.: PCT/EP2013/055563
§ 371 (c)(1),
(2) Date: Sep. 18, 2014

(87) PCT Pub. No.: WO2013/139735
PCT Pub. Date: Sep. 26, 2013

(65) Prior Publication Data
US 2015/0041832 A1 Feb. 12, 2015

(30) Foreign Application Priority Data
Mar. 21, 2012 (DE) .......................... 10 2012 102 420

(51) Int. Cl.
*H01L 23/02* (2006.01)
*H01L 33/62* (2010.01)
*H01L 33/54* (2010.01)
(Continued)

(52) U.S. Cl.
CPC ................ *H01L 33/62* (2013.01); *H01L 33/50* (2013.01); *H01L 33/54* (2013.01); *H01L 33/58* (2013.01); *H01L 33/60* (2013.01); *H01L 33/505* (2013.01);
(Continued)

(58) Field of Classification Search
CPC ............... H01L 27/14618; H01L 2924/01079; H01L 31/0203; H01L 2224/48091
USPC ......................................... 257/680, 687, 688
See application file for complete search history.

(56) References Cited

U.S. PATENT DOCUMENTS

| 2010/0155917 | A1* | 6/2010 | Maruo | .......................... 257/680 |
| 2010/0264438 | A1 | 10/2010 | Suenaga | |
| 2011/0049545 | A1 | 3/2011 | Basin et al. | |
| 2011/0241024 | A1 | 10/2011 | Cho | |

FOREIGN PATENT DOCUMENTS

| DE | 102010033963 A1 | 2/2012 |
| DE | 102010034565 A1 | 2/2012 |

(Continued)

*Primary Examiner* — Quoc Hoang
(74) *Attorney, Agent, or Firm* — McDermott Will & Emery LLP

(57) ABSTRACT

In at least one embodiment of the optoelectronic semiconductor component (1), the optoelectronic semiconductor component has a support (2). At least one optoelectronic semiconductor chip (3) with a radiation outlet face (30) is applied onto a support upper face (20). A sacrificial layer (5) is located over the radiation outlet face (30) in the direction away from the support (2). A housing body (6) which has a housing upper face (60) is molded around the semiconductor chip (3) and/or around the sacrificial layer (5) in a lateral direction parallel to the radiation outlet face (30). A sacrificial layer (5) upper face (50) which faces away from the radiation outlet face (30) is free of a housing body (6) material.

15 Claims, 3 Drawing Sheets

(51) Int. Cl.
    *H01L 33/58* (2010.01)
    *H01L 33/60* (2010.01)
    *H01L 33/50* (2010.01)
(52) U.S. Cl.
    CPC . *H01L 2224/48091* (2013.01); *H01L 2933/005* (2013.01); *H01L 2933/0033* (2013.01)

(56) References Cited

FOREIGN PATENT DOCUMENTS

| EP | 2378573 | A2 | 10/2011 |
| EP | 2378576 | A2 | 10/2011 |

\* cited by examiner

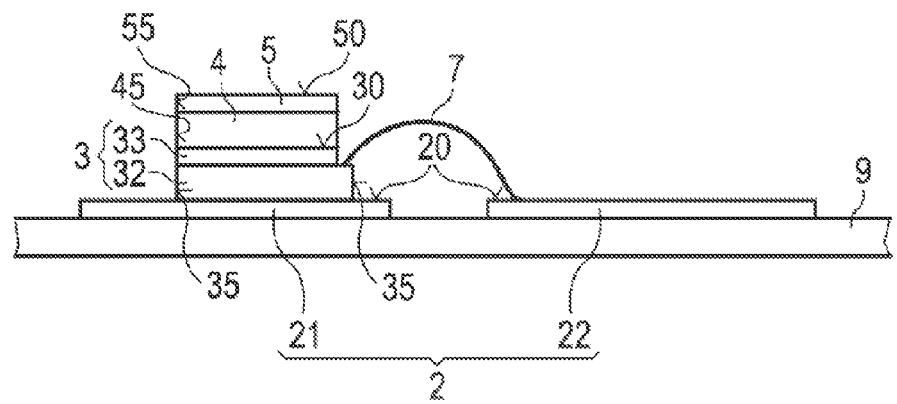
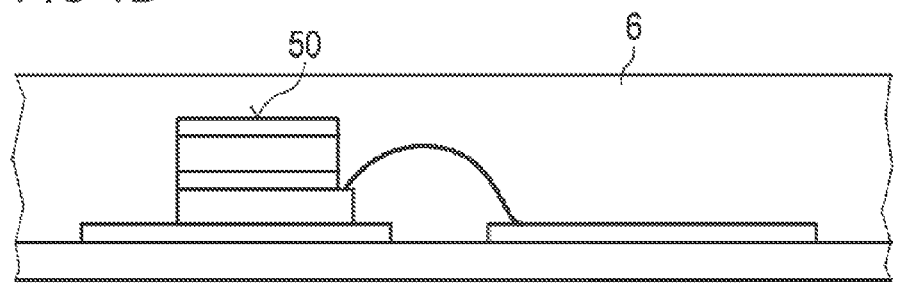
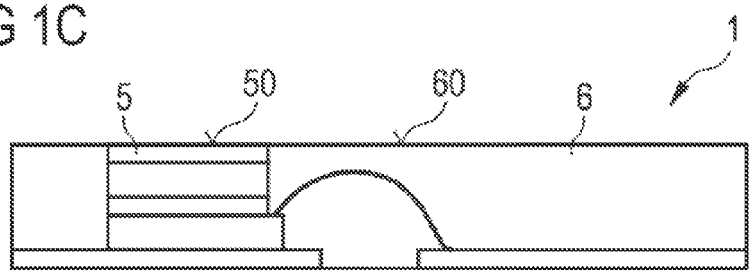

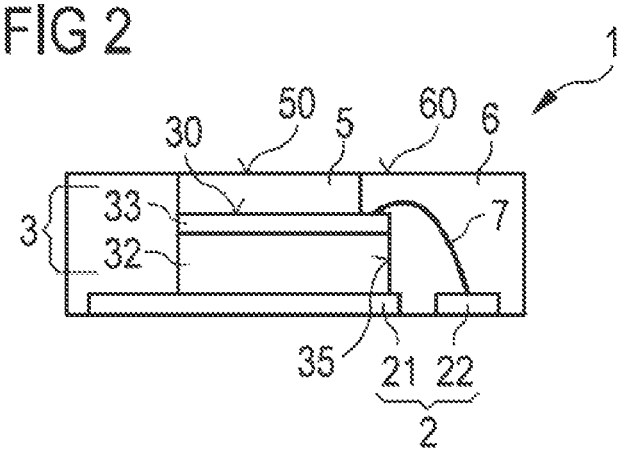
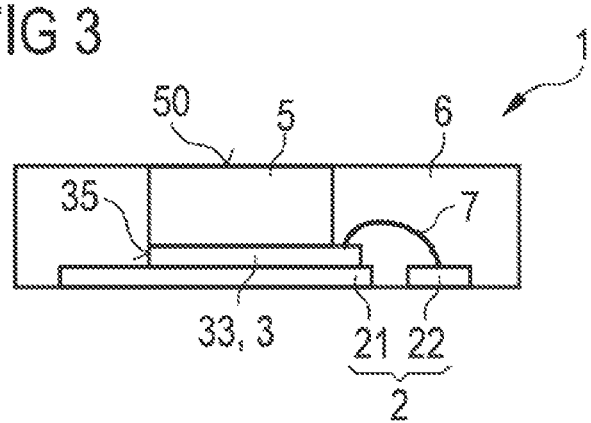
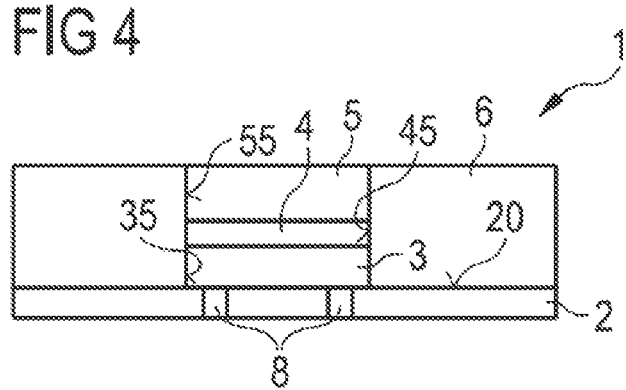

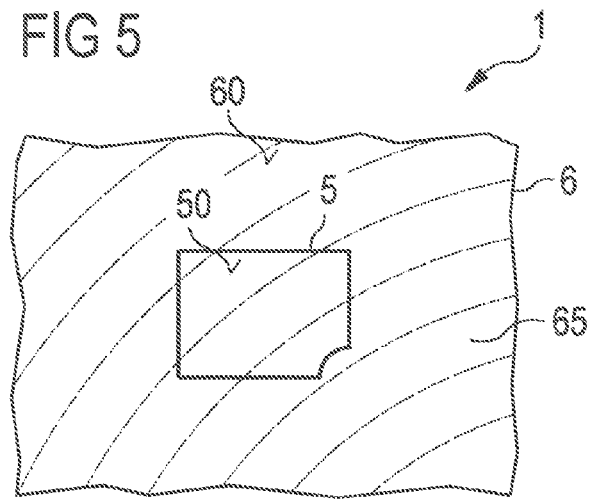
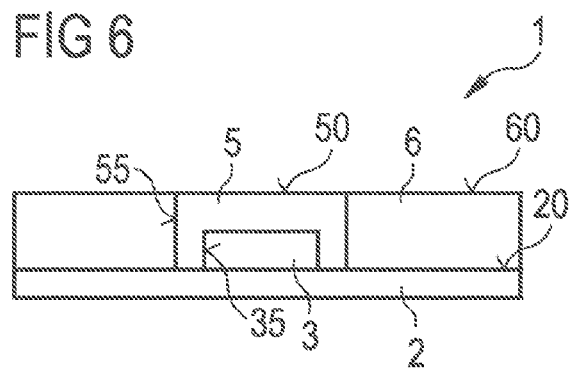
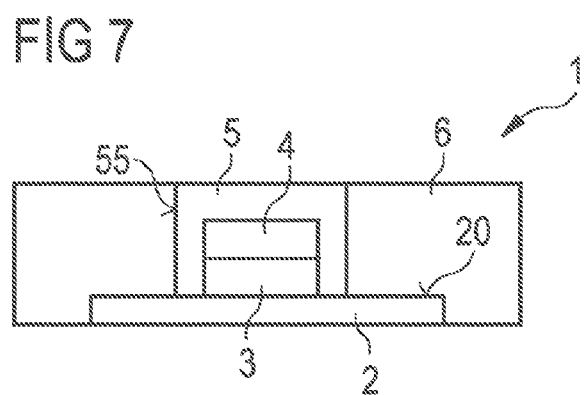

OPTOELECTRONIC SEMICONDUCTOR COMPONENT AND METHOD FOR PRODUCING SUCH AN OPTOELECTRONIC SEMICONDUCTOR COMPONENT

An optoelectronic semiconductor component is specified. Furthermore, a method for producing such an optoelectronic semiconductor component is specified.

One object to be achieved is to specify an optoelectronic semiconductor component which has a high mechanical stability.

This object is achieved, inter alia, by means of an optoelectronic semiconductor component and also by means of a production method, as specified in the independent patent claims. Preferred developments are specified in the dependent patent claims.

In accordance with at least one embodiment of the optoelectronic semiconductor component, the latter comprises one or a plurality of optoelectronic semiconductor chips. The semiconductor chips are preferably designed to emit electromagnetic radiation during the operation of the semiconductor component. A wavelength of the radiation is preferably partly or completely in the ultraviolet, in the visible and/or in the near infrared spectral range. In particular, white light is generated by the semiconductor chip during operation. The semiconductor chip is, for example, a light-emitting diode, LED for short, or a laser diode. Furthermore, the semiconductor component can comprise further semiconductor chips in particular in the form of radiation detectors, temperature sensors and/or protective diodes for protection against damage caused by electrostatic discharges.

In accordance with at least one embodiment, the semiconductor component comprises a carrier having a carrier top side. The at least one semiconductor chip is fitted to the carrier top side. In particular, all the semiconductor chips are mounted at the carrier top side. The carrier is preferably designed to serve for making electrical contact with the semiconductor chip. In particular, the carrier has electrical lines for energizing the semiconductor chip or the carrier is structured to form electrical leads. By way of example, the carrier is a leadframe, a metal-core circuit board, a ceramic circuit board with or without electrical plated-through holes, or a printed circuit board.

In accordance with at least one embodiment, the semiconductor chips are fitted on the carrier in such a way that a radiation exit side of the semiconductor chips faces away from the carrier top side. A main emission of the semiconductor chips preferably takes place at a radiation exit side. The radiation exit side can be oriented perpendicularly to a growth direction of an epitaxial layer sequence of the semiconductor chip. In particular, the radiation exit side is oriented parallel to the carrier top side. The radiation exit side can be provided with a structuring for improving light coupling-out of radiation from the semiconductor chip.

In accordance with at least one embodiment, a sacrificial layer is situated, in a direction away from the carrier, above the radiation exit side. In other words, the radiation exit side, as seen in plan view, is partly or completely covered by the sacrificial layer. The sacrificial layer is preferably formed from a material which is radiation-transmissive to at least part of the radiation emitted by the semiconductor chip during operation. The sacrificial layer is fitted to the radiation exit side indirectly or directly. The sacrificial layer is designed to be partly removed during a method for producing the semiconductor component.

In accordance with at least one embodiment, the semiconductor component comprises a housing body having a housing top side. The housing top side is preferably oriented parallel or substantially parallel to the carrier top side. In particular, the housing top side forms a main side of the housing body which is furthest away from the carrier. It is possible for the housing body to be formed from a radiation-nontransmissive material. Furthermore, it is possible for the housing body to be formed from a material which is not stable for blue or ultraviolet radiation, as emitted for instance by the semiconductor chip during operation. By way of example, the housing body is formed from a thermosetting plastic or from an epoxy.

In accordance with at least one embodiment, the housing body is formed onto the semiconductor chip and/or onto the sacrificial layer all around in a lateral direction. In a lateral direction means, in particular, parallel to the radiation exit side. It is possible that in every side view, parallel to the radiation exit side, the semiconductor chip and the sacrificial layer are in each case completely covered by a material of the housing body. In other words, a material of the housing body is then situated at the semiconductor chip and/or at the sacrificial layer across an entire height of the semiconductor chip and/or the sacrificial layer, in a direction perpendicular to the radiation exit side. Molded onto can mean that no gap and no other material is situated between the semiconductor chip and/or the sacrificial layer and the housing body. In particular, the housing body reproduces an outer shape of the semiconductor chip and/or of the sacrificial layer.

In accordance with at least one embodiment of the semiconductor component, a top side of the sacrificial layer facing away from the radiation exit side of the semiconductor chip is free of a material of the housing body. The top side of the sacrificial layer is therefore not covered by the material of the housing body.

In at least one embodiment of the optoelectronic semiconductor component, the latter comprises a carrier having a carrier top side. At least one optoelectronic semiconductor chip having a radiation exit side is fitted to the carrier top side. A sacrificial layer is situated, in a direction away from the carrier, above the radiation exit side. A housing body having a housing top side is formed onto the semiconductor chip and/or onto the sacrificial layer all around in a lateral direction, parallel to the radiation exit side. A top side of the sacrificial layer facing away from the radiation exit side is free of a material of the housing body.

The optical and the mechanical properties of materials, in particular for the housing body, are generally not adjustable independently of one another. Specifically, transparent, radiation-transmissive materials having a high resistance to blue or ultraviolet radiation often have only a low mechanical hardness or stiffness. The use of the sacrificial layer makes it possible to take account of primarily the mechanical properties in the choice of materials for the housing body. As a result, comparatively mechanically stable housing bodies can be used in a cost-effective manner. Furthermore, it is possible to use for the housing body materials which have a comparatively high thermal conductivity and can lead to better dissipation of heat from the semiconductor component.

In accordance with at least one embodiment of the semiconductor component, a basic area of the sacrificial layer, as seen in a plan view of the radiation exit side of the semiconductor chip, is at most 50% or at most 25% or at most 15% greater than a basic area of the semiconductor chip. It is possible for the sacrificial layer and the semiconductor chip to have identical basic areas. This is likewise possible for a maximum area of the sacrificial layer, as seen in a plan view of the radiation exit side. In other words, as seen in plan view, both the sacrificial layer and the semiconductor chip have identical or approximately identical geometrical dimensions.

In accordance with at least one embodiment of the semiconductor component, the top side of the sacrificial layer and the housing top side of the housing body lie in a common plane. The top side of the sacrificial layer and the housing top side can therefore terminate flush and run smoothly with respect to one another.

In accordance with at least one embodiment of the semiconductor component, the latter comprises at least one conversion element. The conversion element is designed to convert radiation generated by the semiconductor chip into radiation having a different wavelength, in particular radiation having a longer wavelength. The conversion element comprises or consists of one or a plurality of phosphors.

In accordance with at least one embodiment of the semiconductor component, the conversion element is situated between the semiconductor chip and the sacrificial layer. In particular, the conversion element is directly connected both to the semiconductor chip and to the sacrificial layer. Directly connected can mean that the conversion element is in physical contact with the sacrificial layer and/or the semiconductor chip or that at most a connection means such as an adhesive is situated between the sacrificial layer and/or the semiconductor chip and the conversion element.

In accordance with at least one embodiment, the conversion element, as seen in a plan view of the radiation exit side, is completely covered by the sacrificial layer. In that case, the conversion element does not project beyond the sacrificial layer in a lateral direction. It is likewise possible that the conversion element does not project beyond, or does not project significantly beyond, the semiconductor chip, in a lateral direction. Furthermore, it is possible that the semiconductor chip, as seen in plan view, is completely covered by the conversion element and that the conversion element is in turn completely covered by the sacrificial layer.

In accordance with at least one embodiment, the sacrificial layer and the conversion element are formed from different materials. If the sacrificial layer and the conversion element comprise a matrix material, for example, into which further particles of a further material are optionally embedded, then the matrix materials of the sacrificial layer and of the conversion element differ from one another. However, the matrix materials can belong to the same material class, for example the material class of the silicones or silicone-epoxy hybrid materials.

In accordance with at least one embodiment of the semiconductor component, the sacrificial layer and the conversion element have side surfaces terminating flush with one another. In other words, the side surfaces of the sacrificial layer and the side surfaces of the conversion element can run in extension with respect to one another and merge smoothly into one another. The side surfaces of the sacrificial layer and of the conversion element can terminate flush with one another in places or all around. It is likewise possible for the side surfaces of the semiconductor chip to terminate flush with the side surfaces of the conversion element.

In accordance with at least one embodiment, the side surfaces of the semiconductor chip are in direct contact with the housing body. Preferably, the side surfaces of the sacrificial layer are likewise in direct contact with the housing body. In this case, the housing body can contribute efficiently to dissipation of heat from the semiconductor chip.

In accordance with at least one embodiment of the semiconductor component, the carrier is a leadframe. The carrier has at least two leadframe parts. By way of example, the semiconductor chip is mechanically and electrically directly connected precisely to one of the leadframe parts, for instance by means of soldering or adhesive bonding, and is only electrically directly connected to another of the leadframe parts by an electrical connection means, for example in the form of a bonding wire. As an alternative thereto, it is possible for the semiconductor chip to be mechanically and electrically directly connected to two of the leadframe parts. In the last-mentioned case, the semiconductor chip is, in particular, a so-called flip-chip, in which electrical connection locations are situated at a single main side.

In accordance with at least one embodiment of the semiconductor component, the electrical connection means is embedded into the housing body in regions or completely. In other words, the housing body is formed onto the connection means. As seen in cross section, the connection means is surrounded all around by a material of the housing body in a positively locking manner, along a partial region or completely along a straight or curved longitudinal axis of the connection means.

In accordance with at least one embodiment, the leadframe parts are mechanically connected to one another by means of the housing body. In particular, the housing body is the element which mechanically supports and bears the semiconductor component. In particular, the leadframe parts are connected mechanically with load-bearing capacity only or substantially only by means of the housing body.

In accordance with at least one embodiment of the semiconductor component, the sacrificial layer, as seen in a plan view of the radiation exit side, is situated only above a single one of the leadframe parts, in particular above the leadframe part on which the semiconductor chip is fitted. As a result, it is possible to obtain a more homogeneous external appearance of the semiconductor component, for example when the semiconductor component is not in operation.

In accordance with at least one embodiment of the semiconductor component, the sacrificial layer touches the radiation exit side of the semiconductor component. In other words, the sacrificial layer is then fitted directly on the semiconductor chip.

In accordance with at least one embodiment of the semiconductor component, the sacrificial layer comprises a filter means, a scattering means and/or a reflection means. By way of example, the filter means, the scattering means and/or the reflection means are/is formed by particles mixed into the matrix material of the sacrificial layer. The sacrificial layer can also contain a conversion means, but the sacrificial layer is preferably free of a conversion means for wavelength conversion of radiation generated by the semiconductor chip. In particular, it is possible that the sacrificial layer does not influence, or does not significantly influence, a spectral composition of the radiation emitted by the semiconductor component. The sacrificial layer can also be transparent.

In accordance with at least one embodiment of the semiconductor component, an emission area of the semiconductor component is formed by the sacrificial layer, in particular by the top side of the sacrificial layer. In other words, radiation generated in the semiconductor chip then leaves the semiconductor component at a boundary surface of the sacrificial layer, in particular only at the top side of the sacrificial layer.

In accordance with at least one embodiment of the semiconductor component, the housing body and the radiation exit side do not overlap, as seen in plan view. In other words, the radiation exit side is then not covered by the housing body.

In accordance with at least one embodiment, a total thickness of the semiconductor component is equal to a thickness of the housing body, in particular in a direction perpendicular to the radiation exit side and preferably with a tolerance of at most 10% or of at most 5%. A thickness of the semiconductor component is then substantially determined by the thickness of the housing body. By way of example, the housing body extends completely from an underside as far as a top side of the semiconductor component and forms part of the top side and of the underside of the semiconductor component.

In accordance with at least one embodiment of the semiconductor component, an average thickness of the sacrificial layer is at least 5 μm or at least 10 μm or at least 20 μm. Alternatively or additionally, the average thickness of the sacrificial layer is at most 250 μm or at most 50 μm or at most 30 μm.

In accordance with at least one embodiment of the semiconductor component, a thickness of the housing body and/or of the semiconductor component is at least 150 μm or at least 200 μm or at least 250 μm. Alternatively or additionally, the thickness of the housing body and/or of the semiconductor component is at most 1000 μm or at most 800 μm or at most 600 μm or at most 500 μm.

In accordance with at least one embodiment of the semiconductor component, the sacrificial layer is formed by a grindable silicone, epoxy or silicone-epoxy hybrid material or comprises such a material, for example as matrix material. Grindable means that a material of the sacrificial layer is removable by means of a grinding process. By way of example, the sacrificial layer comprises or consists of a dimethoxysiloxane or a diphenylsiloxane. Preferably, the sacrificial layer has a hardness of at least Shore A 80 at room temperature.

In accordance with at least one embodiment of the semiconductor component, the top side of the sacrificial layer and the housing top side have continuous processing traces. Such processing traces can originate for example from grinding, etching, milling or scraping. The processing traces can be, in particular, grooves extending continuously and in an uninterrupted manner from the housing body to the sacrificial layer. By virtue of such processing traces, it is also possible to realize a structuring of the housing top side and the top side of the sacrificial layer, for example for improved radiation coupling-out of radiation out of the semiconductor component.

Furthermore, a method for producing an optoelectronic semiconductor component is specified. The method preferably produces a semiconductor component as specified in connection with one or more of the embodiments mentioned above. Features of the method are therefore also disclosed for the optoelectronic semiconductor component, and vice versa.

In at least one embodiment, the method comprises at least the following steps:
providing at least one optoelectronic semiconductor chip having a radiation exit side,
fitting the semiconductor chip on a carrier top side of a carrier,
applying a radiation-transmissive sacrificial layer at least to the radiation exit side,
creating a housing body of the semiconductor component by means of molding or pressing, wherein a material of the housing body extends above a top side of the sacrificial layer facing away from the semiconductor chip, and
removing at least the material of the housing body which is situated above the top side of the sacrificial layer. The method steps are preferably carried out in the order indicated, but a different order, insofar as is technically possible, can likewise be realized.

In accordance with at least one embodiment of the method, the housing body is created only after the semiconductor chip is fitted on the carrier. The housing body is then not a prefabricated housing body into which the semiconductor chip is mounted.

In accordance with at least one embodiment, the housing body is created after the sacrificial layer is applied above the radiation exit side of the semiconductor chip.

In such a method it is possible to produce the housing body in particular by means of molding or pressing. The housing body is preferably created only after all further component parts of the semiconductor component are produced and mounted. During the production of the housing body, the sacrificial layer is partly or completely covered by the material of the housing body. This material of the housing body is removable, wherein a material of the sacrificial layer can also be partly removed concomitantly during this removal. In other words, the sacrificial layer can serve as a protective layer for the semiconductor chip during the process of creating the housing body and during processing of the housing body. Preferably, a material of the sacrificial layer always remains on the finished produced semiconductor component.

An optoelectronic semiconductor component described here and also a method described here are explained in greater detail below on the basis of exemplary embodiments with reference to the drawing. In this case, identical reference signs indicate identical elements in the individual figures. In this case, however, relations to scale are not illustrated; rather, individual elements may be illustrated with an exaggerated size in order to afford better understanding.

In the figures:

FIG. 1 shows a schematic illustration of an exemplary embodiment of a method described here for producing an optoelectronic semiconductor component described here and FIGS. 2 to 7 show schematic illustrations of exemplary embodiments of optoelectronic semiconductor components described here.

An exemplary embodiment of a method for producing an optoelectronic semiconductor component 1 is illustrated in schematic sectional illustrations in FIG. 1. In accordance with FIG. 1A, a carrier 2 is provided. The carrier 2 is fashioned as a leadframe and has the two leadframe parts 21, 22. An optoelectronic semiconductor chip 3, for example a light-emitting diode, is fitted to a top side 20 of the leadframe part 21. The semiconductor chip 3 comprises a chip substrate 32 and a semiconductor layer sequence 33 fitted to the chip substrate 32. It is possible for the chip substrate 32 to project laterally beyond the semiconductor layer sequence 33 at least at a corner region.

Electrical contact is made with the semiconductor chip 3 via the two leadframe parts 21, 22. An electrical connection from the semiconductor chip 3 to the leadframe part 22 is produced via an electrical connection means 7. The connection means 7 is preferably a bonding wire. In contrast to the illustration in FIG. 1, the bonding wire, instead of being connected to the chip substrate 32, can also be directly connected to the semiconductor layer sequence 33. Moreover, it is possible for an additional heat sink to be present and for the semiconductor layer sequence 33 to be electrically contact-connected to the leadframe parts 21, 22 via two bonding wires.

A conversion element 4 for wavelength conversion of radiation generated by the semiconductor chip 3 during operation is preferably fitted to a radiation exit side 30 of the semiconductor chip 3 facing away from the carrier 2. The optional conversion element 4 can be adhesively bonded on the radiation exit side 30 or else produced directly on the radiation exit side 30, for example by means of screen printing. The conversion element 4 covers the entire semiconductor layer sequence 33 and thus the entire radiation exit side 30.

A sacrificial layer 5 having a top side 50 is situated at a side of the conversion element 4 facing away from the semiconductor chip 3, the top side 50 facing away from the carrier 2. The sacrificial layer 5 is formed by a different, in particular more brittle, material than the conversion element 4. Within the scope of the production tolerances, the semiconductor layer sequence 33, the conversion element 4 and the sacrificial layer 5 are arranged congruently one above another. Side surfaces 35 of the semiconductor chip 3, side surfaces 45 of the conversion element 4 and side surfaces 55 of the sacrificial layer 5 terminate flush with one another and run in extension with respect to one another.

Optionally, as also in all other exemplary embodiments, the carrier 2 can be fitted on a temporary intermediate carrier 9. The intermediate carrier 9 serves, in particular, for fixing the leadframe parts 21, 22 relative to one another during the production method. The intermediate carrier 9 is not a constituent of the finished produced semiconductor component 1.

FIG. 1B illustrates the production of a housing body 6. The housing body 6 is produced, in particular, by molding or by pressing. The housing body 6 is formed onto the semiconductor chip 3, onto the conversion element 4, onto the sacrificial layer 5, onto the connection means 7 and onto the leadframe parts 21, 22 in a positively locking manner. The top side 50 of the sacrificial layer 5 is covered by a material of the housing body 6. The material of the housing body 6 is, in particular, nontransmissive to radiation generated by the semiconductor chip 3 during operation and to radiation converted by the conversion element 4. The leadframe parts 21, 22 are mechanically connected to one another by the housing body 6.

In contrast to the illustration in FIG. 1B, it is also possible for the top side 50 to be covered only partly by the material of the housing body 6 during the production of the housing body 6.

In accordance with FIG. 1C, the material of the housing body 6 and of the sacrificial layer 5 is partly removed, such that the top side 50 of the sacrificial layer 5 arises and is exposed. The sacrificial layer 5 is exposed by means of etching or grinding, for example. For example, in the process of exposing the sacrificial layer 5 a thickness of the sacrificial layer 5 is reduced by at least 10% or by at least 25% and alternatively or additionally by at most 90% or by at most 50%. A thickness of the semiconductor component 1 corresponds to a thickness of the housing body 6. The intermediate carrier 9 is removed in FIG. 1C. During the production of the housing body 6, the intermediate carrier 9 can be part of, or situated in, a pressing mold or injection mold.

A further exemplary embodiment of the semiconductor component 1 is shown in a schematic sectional illustration in FIG. 2. In this exemplary embodiment, the sacrificial layer 5 is applied directly on the radiation exit side 30 of the semiconductor chip 3. The sacrificial layer 5 can be adhesively bonded or produced directly, for example by means of a printing method, on the radiation exit side 30. The radiation exit side 30 is completely covered by the sacrificial layer 5, with the exception of a connection region for the connection means 7. The leadframe parts 21, 22 can be shaped with different sizes.

In accordance with FIG. 3, the semiconductor chip 3 is a so-called thin-film chip. The semiconductor chip 3 then substantially only consists of the semiconductor layer sequence 33. A chip substrate 32 is not present. A thickness of the semiconductor chip 3 is, for example, at most 12 μm or at most 8 μm or at most 5 μm. The sacrificial layer 5 can then have a larger thickness than the semiconductor chip 3.

As also in all other exemplary embodiments, the thickness of the sacrificial layer 5 can be between 10 μm and 50 μm inclusive. The sacrificial layer is formed from a grindable silicone. Optionally, a conversion element 4 can also be fitted between the sacrificial layer 5 and the semiconductor chip 3. It is likewise possible, as in all other exemplary embodiments, for the sacrificial layer 5 to comprise, for example, titanium dioxide particles as diffusion means. Furthermore, it is possible in each case for the conversion element 4 and the sacrificial layer 5 to be shaped integrally. In this case, a concentration gradient of, for instance, a diffusion means or a conversion means can be present in the sacrificial layer 5, preferably a lowest concentration being present at the top side 50.

In the exemplary embodiment in accordance with FIG. 4, the carrier 2 is provided with electrical plated-through holes 8 extending from the carrier top side 20 to a carrier underside. Planar electrical contact regions of the carrier 2 are not illustrated in FIG. 4, nor is a detailed routing of the electrical lines in the semiconductor chip 3. Along a lateral direction, the carrier 2 and the housing body 6 can have the same dimensions. A total thickness of the semiconductor component 1 corresponds to the sum of the thicknesses of the carrier 2 and of the housing body 6.

FIG. 5 shows a schematic plan view of a further exemplary embodiment of the semiconductor component 1. The semiconductor component is shaped, for instance, as indicated in connection with FIGS. 1 to 3.

Processing traces 65 in the form of grinding traces, for example, are situated at the top side 50 of the sacrificial layer 5 and also at the housing top side 60. The processing traces 65 extend at least partly continuously from the housing body 6 across the sacrificial layer 5. In contrast to the illustration, it is possible for the processing traces 65 not to be curved, but rather to run along straight lines. Preferably, the processing traces 65 are more densely packed than is depicted in FIG. 5.

FIG. 6 shows an exemplary embodiment of the semiconductor component 1, wherein the sacrificial layer 5 is also situated at the side surfaces 35 of the semiconductor chip 3. As also in FIG. 7, FIG. 6 does not show electrical contact-connection of the semiconductor chip 3, in order to simplify the illustration. The carrier 2 is a circuit board, for example, which can also be used in all other exemplary embodiments.

The sacrificial layer 5 is formed for example by being applied dropwise or by being printed onto the semiconductor chip 3. It is possible for the sacrificial layer 5 to be formed like a truncated pyramid or like a truncated cone. In other words, it is possible that, in a direction away from the carrier 2, opposite side surfaces 55 of the sacrificial layer 5 are drawn toward one another. A width of the sacrificial layer 5 at the carrier top side 20 is then greater than at the top side 50. The housing body 6 is therefore only in direct contact with the sacrificial layer 5 and not with the semiconductor chip 3.

In accordance with FIG. 7, the sacrificial layer 5 has side walls 55 running perpendicularly to the carrier top side 20. In accordance with FIG. 7, too, the housing body 6 is not in direct contact with the semiconductor chip 3 or with the conversion element 4. It is possible for a filter means to be admixed with the sacrificial layer 5, such that the sacrificial layer 5 is nontransmissive, in particular to ultraviolet radiation, such that no ultraviolet radiation passes from the semiconductor chip 3 to the housing body 6.

Furthermore, it is possible, as also in all other exemplary embodiments, that particles for increasing a thermal conductivity are admixed with the housing body 6. Likewise, the housing body 6 can be embodied as reflective to radiation emitted by the semiconductor chip 3, as also in all other exemplary embodiments, or—as an alternative thereto—absorbent. By way of example, carbon black particles or white particles composed of titanium dioxide can be admixed with the housing body 6.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German Patent Application 10 2012 102 420.0, the disclosure content of which is hereby incorporated by reference.

The invention claimed is:

1. An optoelectronic semiconductor component comprising
a carrier having a carrier top side,
at least one optoelectronic semiconductor chip having a radiation exit side, said at least one optoelectronic semiconductor chip being fitted to the carrier top side,
a sacrificial layer situated, in a direction away from the carrier, above the radiation exit side,
a housing body having a housing top side,
wherein the housing body is molded to the semiconductor chip and/or to the sacrificial layer all around in a lateral direction, parallel to the radiation exit side, and
wherein a top side of the sacrificial layer facing away from the radiation exit side is free of a material of the housing body, and
a conversion element for wavelength conversion of the radiation generated by the semiconductor chip situated between the radiation exit side and the sacrificial layer, wherein the conversion element, as seen in a plan view of the radiation exit side, is completely covered by the sacrificial layer, and wherein the sacrificial layer and the conversion element are molded from different materials, wherein the sacrificial layer comprises a filter means, and the sacrificial layer covers side surfaces of the semiconductor chip and of the conversion element, wherein the housing body is in direct contact to the sacrificial layer and has no direct contact to the semiconductor chip and to the conversion element.

2. The optoelectronic semiconductor component according to claim 1,
wherein, as seen in a plan view of the radiation exit side, an area of the sacrificial layer is at most 50% greater than a basic area of the semiconductor chip,
wherein the top side of the sacrificial layer and the housing top side lie in a common plane.

3. The optoelectronic semiconductor component according to claim 1,
wherein the sacrificial layer and the conversion element have side surfaces terminating flush with one another,
wherein side surfaces of the semiconductor chip are in direct contact with the housing body.

4. The optoelectronic semiconductor component according to claim 1,
wherein the carrier is formed by at least two leadframe parts of a leadframe, wherein the semiconductor chip is fixed on one of the leadframe parts and is electrically connected to another of the leadframe parts via an electrical connection means, wherein the connection means is embedded into the housing body at least in regions.

5. The optoelectronic semiconductor component according to claim 4,
wherein the leadframe parts are mechanically connected to one another by the housing body,
wherein the sacrificial layer, as seen in a plan view of the radiation exit side, is situated only above a single one of the leadframe parts.

6. The optoelectronic semiconductor component according to claim 1,
wherein the sacrificial layer touches the radiation exit side of the semiconductor chip.

7. The optoelectronic semiconductor component according to claim 1,
wherein the sacrificial layer further comprises a scattering means and/or a reflection means.

8. The optoelectronic semiconductor component according to claim 1,
wherein a total thickness of the semiconductor component is equal to a thickness of the housing body, with a tolerance of at most 10%,
wherein, as seen in plan view, the radiation exit side and the housing body do not overlap.

9. The optoelectronic semiconductor component according to claim 1,
wherein an average thickness of the sacrificial layer is between 5 μm and 50 μm inclusive or between 10 μm and 250 μm inclusive.

10. The optoelectronic semiconductor component according to claim 1,
wherein the sacrificial layer comprises or consists of a grindable silicone, epoxy or silicone-epoxy hybrid material.

11. The optoelectronic semiconductor component according to claim 1,
wherein the top side of the sacrificial layer and the housing top side have continuous processing traces.

12. The optoelectronic semiconductor component according to claim 1,
wherein
side surfaces of the semiconductor chip are in direct contact with the housing body and at least one of said side surfaces terminates flush with side surfaces of the sacrificial layer,
an average thickness of the sacrificial layer is between 5 μm and 50 μm inclusive or between 10 μm and 250 μm inclusive, and
the sacrificial layer consists of a grindable silicone, epoxy or silicone-epoxy hybrid material.

13. A method for producing an optoelectronic semiconductor component according to claim 1, comprising the following steps:
providing at least one optoelectronic semiconductor chip having a radiation exit side,
fitting the semiconductor chip on a carrier top side of a carrier,
applying a radiation-transmissive sacrificial layer at least to the radiation exit side,
creating a housing body of the semiconductor component by means of molding or pressing, wherein a material of the housing body extends above a top side of the sacrificial layer facing away from the semiconductor chip, and
removing at least the material of the housing body which is situated above the top side of the sacrificial layer.

14. The method according to claim 13,
wherein the housing body is created after the semiconductor chip is fitted on the carrier and additionally after the sacrificial layer is applied above the radiation exit side,
wherein a material of the sacrificial layer is also removed during the removal of the material above the top side of the sacrificial layer.

15. The optoelectronic semiconductor component according to claim 1, wherein the filter means is nontransmissive to ultraviolet radiation.

\* \* \* \* \*